United States Patent
Wei et al.

(10) Patent No.: US 8,884,794 B2
(45) Date of Patent: Nov. 11, 2014

(54) SIGNAL RECEIVING DEVICE AND ELECTRONIC APPARATUS USING THE SAME

(71) Applicant: Beyond Innovation Technology Co., Ltd., Taipei (TW)

(72) Inventors: Tsung-Ping Wei, Taipei (TW); Chia-Hsin Chen, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 0 days.

(21) Appl. No.: 13/798,133

(22) Filed: Mar. 13, 2013

(65) Prior Publication Data
US 2013/0321186 A1 Dec. 5, 2013

(30) Foreign Application Priority Data
Jun. 1, 2012 (TW) .............................. 101119823 A

(51) Int. Cl.
*H03M 1/00* (2006.01)
*H03M 1/12* (2006.01)
*H03M 1/18* (2006.01)

(52) U.S. Cl.
CPC ................ *H03M 1/001* (2013.01); *H03M 1/12* (2013.01); *H03M 1/00* (2013.01); *H03M 1/183* (2013.01)

USPC .......................................... 341/139; 341/155

(58) Field of Classification Search
CPC ................................. H03M 1/00; H03M 1/12
USPC .................................. 341/139, 155, 156, 120
See application file for complete search history.

(56) References Cited

U.S. PATENT DOCUMENTS

| 8,130,323 B2 * | 3/2012 | Hilder ........................... 348/572 |
| 2003/0080891 A1 * | 5/2003 | Nagano ........................ 341/155 |

* cited by examiner

*Primary Examiner* — Joseph Lauture
(74) *Attorney, Agent, or Firm* — Winston Hsu; Scott Margo

(57) ABSTRACT

A signal receiving device and an electronic apparatus using the same are provided. The signal receiving device includes a signal conversion unit, a signal analysis unit, and an impedance unit. The signal conversion unit receives an analog input signal and converts the analog input signal into a digital input signal. The signal analysis unit receives the digital input signal and analyzes a signal characteristic thereof to generate an impedance adjustment signal. The impedance unit coupled to the signal analysis unit and a signal input terminal of the signal receiving device receives the impedance adjustment signal to dynamically adjust an input impedance of the signal input terminal. Thereby, the signal receiving device analyzes an input signal to dynamically adjust the input impedance of the signal receiving device, so as to maintain an amplitude gain of the input signal to be within a limited input range of the signal receiving device.

8 Claims, 2 Drawing Sheets

SIGNAL RECEIVING DEVICE AND ELECTRONIC APPARATUS USING THE SAME

CROSS-REFERENCE TO RELATED APPLICATION

This application claims the priority benefit of Taiwan application serial no. 101119823, filed on Jun. 1, 2012. The entirety of the above-mentioned patent application is hereby incorporated by reference herein and made a part of this specification.

BACKGROUND OF THE INVENTION

1. Field of the Invention

The invention generally relates to a signal receiving technique, and more particularly, to a signal receiving device which analyzes an input signal and automatically adjusts the input impedance of the input signal and an electronic apparatus using the same.

2. Description of Related Art

Conventionally, a signal buffer is usually disposed at the signal input terminal of an electronic apparatus. This signal buffer allows an input signal to maintain a reasonable voltage level before the input signal is sent to a signal processing unit (for example, a processing chip) in the electronic apparatus. Or, a rated input resistor is disposed at the signal input terminal of the electronic apparatus according to the standard specification of the input signal.

However, in an existing electronic apparatus, the signal buffer may be removed or the impedance of the input resistor may be changed due to the updated fabrication process and the consideration of the fabrication cost. When the signal buffer is removed, the impedance of the input resistor is changed, or the signal input terminal of the electronic apparatus cannot predict too large or too small amplitude of the input signal, the electronic apparatus can only calibrate the input signal to avoid any distortion of the input signal through the gain control function and the signal clamping function of the signal processing unit.

Below, the situation mentioned above will be explained with an example. FIG. 1 is a diagram of a general image application system 100 (for example, a television signal sharing application or a monitor controlling application adopting image transmitting/processing techniques). In the image application system 100 in FIG. 1, in order to allow multiple electronic apparatuses 110 (for example, televisions) to obtain the same input signal 130 (for example, an image signal) at the same time, the signal input terminals 115 of the electronic apparatuses 110 are connected with each other in parallel and are electrically connected to the same image signal source 120. When the amplitude of the input signal 130 is too small, the electronic apparatuses 110 can amplify the input signal 130 through the gain control function of the signal processing unit 140 (for example, a image processing chip) to resolve aforementioned problem.

However, when the signal input terminals 115 of the electronic apparatuses 110 are connected with each other in parallel, the impedance of the rated input resistor RR of each electronic apparatus 110 attenuates drastically. In some techniques, the input resistors RR are removed to avoid the signal attenuation problem. However, through such a technique, the amplitude of the input signal 130 is amplified several times. If the amplitude of the input signal 130 is too large and exceeds a limited input range of the signal processing unit 140 (assumed to be the voltage input range of the signal processing unit 140, namely, the peak-to-peak voltage (upper limit) of the input signal should not exceed 1.5V), the portion of the input signal 130 exceeding the limited input range (1.5V) is clamped and discard. Because the signal processing unit 140 cannot obtain the discarded portion of the input signal 130 during the backend processing, the input signal 130 is distorted.

Thereby, how to allow the electronic apparatus to receive a lossless input signal when aforementioned problems exist is a major subject in existing signal transmitting/processing techniques.

SUMMARY OF THE INVENTION

Accordingly, the invention is directed to a signal receiving device and an electronic apparatus using the same. The signal receiving device analyzes an input signal to dynamically adjust an input impedance, so as to maintain an amplitude gain of the input signal to be within a limited input range of the signal receiving device. Additionally, in the signal receiving device, an input resistor originally disposed outside an integrated circuit (IC) is implemented by using a transistor inside the IC, so as to reduce the fabrication cost of the electronic apparatus.

The invention provides a signal receiving device. The signal receiving device includes a signal conversion unit, a signal analysis unit, and an impedance unit. The signal conversion unit receives an analog input signal and converts the analog input signal into a digital input signal. The signal analysis unit is coupled to the signal conversion unit. The signal analysis unit receives the digital input signal and analyzes a signal characteristic of the digital input signal to generate an impedance adjustment signal. The impedance unit is coupled to the signal analysis unit and a signal input terminal of the signal receiving device. The impedance unit receives the impedance adjustment signal to dynamically adjust an input impedance of the signal input terminal.

According to an embodiment of the invention, the signal analysis unit includes a gain analysis module and a digital-to-analog conversion module. The gain analysis module receives the digital input signal and analyzes an amplitude gain of the digital input signal relative to a predetermined signal to generate a digital impedance signal. The digital-to-analog conversion module is coupled to the gain analysis module. The digital-to-analog conversion module receives the digital impedance signal and converts the digital impedance signal into the analog impedance adjustment signal.

According to an embodiment of the invention, the impedance unit includes a transistor. A first terminal of the transistor is coupled to a signal input terminal of an image signal source, a second terminal of the transistor is coupled to the ground (GND), and a third terminal of the transistor receives the impedance adjustment signal.

According to an embodiment of the invention, the signal conversion unit, the signal analysis unit, and the impedance unit are implemented as a signal processing chip.

The invention provides an electronic apparatus. The electronic apparatus includes a signal receiving device and a processing unit. The signal receiving device receives an analog input signal from a signal source and converts the analog input signal into a digital input signal. The processing unit receives and processes the digital input signal. The signal receiving device includes a signal conversion unit, a signal analysis unit, and an impedance unit. The signal conversion unit receives an analog input signal and converts the analog input signal into a digital input signal. The signal analysis unit is coupled to the signal conversion unit. The signal analysis unit receives the digital input signal and analyzes a signal characteristic of the digital input signal to generate an impedance adjustment signal. The impedance unit is coupled to the signal analysis unit and a signal input terminal of the signal receiving device. The impedance unit receives the impedance adjustment signal to dynamically adjust an input impedance of the signal input terminal.

Other implementation details of the electronic apparatus using the signal receiving device can be referred to foregoing description and will not be described herein.

As described above, in a signal receiving device provided by an embodiment of the invention, the amplitude gain of an input signal is analyzed through an auto gain control technique, and the input impedance of the signal receiving device is dynamically adjusted by using an impedance unit, so that the amplitude gain of the input signal can be maintained within a limited input range of the signal receiving device. On the other hand, in the signal receiving device, an input resistor originally disposed outside an IC is implemented by using an impedance unit (for example, a metal-oxide-semiconductor field-effect transistor (MOSFET)) inside the IC, so that the fabrication cost of the electronic apparatus is reduced. Herein the impedance of the impedance unit can be adjusted to an appropriate value according to the actual requirement.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
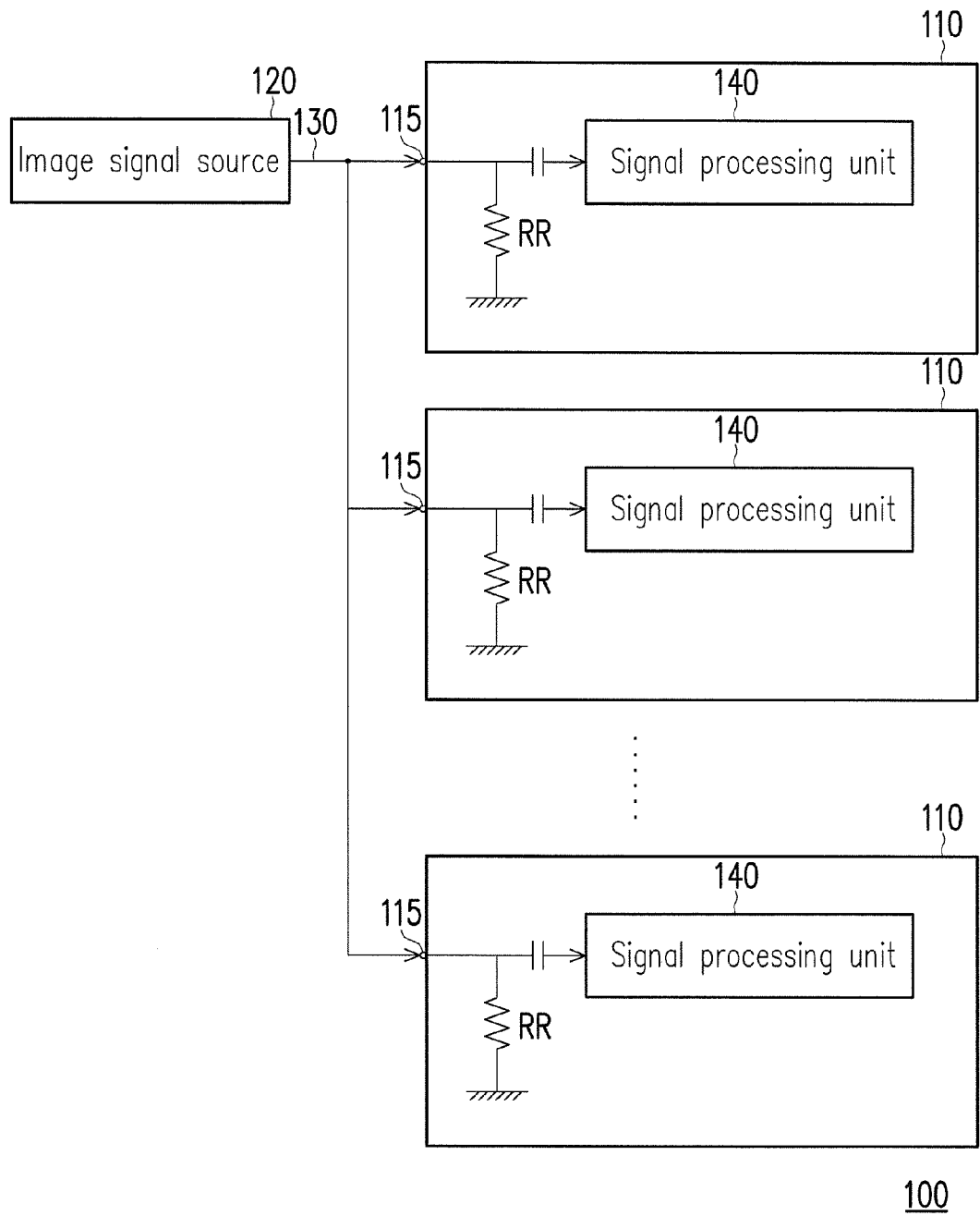
FIG. 1 is a diagram of a image application system.

Reference will now be made in detail to the present preferred embodiments of the invention, examples of which are illustrated in the accompanying drawings. Wherever possible, the same reference numbers are used in the drawings and the description to refer to the same or like parts.

In order to prevent an input signal from being distorted in an electronic apparatus due to the coupling relation between the signal input terminals of multiple electronic apparatuses or due to the absence of a signal buffer or input resistor at the signal input terminal of the electronic apparatus, in a signal receiving device provided by an embodiment of the invention, the input signal is analyzed through an auto gain control technique, and the input impedance of the signal receiving device in the electronic apparatus is dynamically adjusted, so that the amplitude gain of the input signal can be maintained within a limited input range of the signal receiving device and the input signal is prevented from being distorted. Additionally, in the signal receiving device, an input resistor originally disposed outside an integrated circuit (IC) is implemented by using a transistor inside the IC, so that the fabrication cost of the electronic apparatus is reduced.

Figure 2:
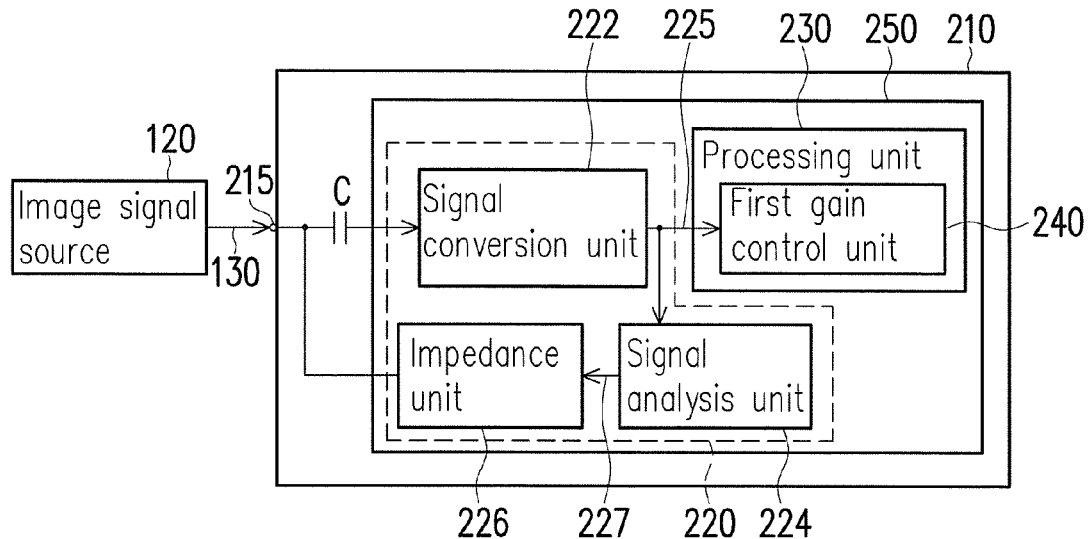
FIG. 2 is a function block diagram of an electronic apparatus according to an embodiment of the invention.

Below, an embodiment of the invention will be described with reference to an application of related synchronous image signal transmission/display techniques. However, those implementing the present embodiment may also apply the spirit of the present embodiment to other signal transmission related fields, and such applications will not be described herein. FIG. 2 is a function block diagram of an electronic apparatus 210 according to an embodiment of the invention. As shown in FIG. 2, the electronic apparatus 210 includes a signal receiving device 220 and a processing unit 230. The signal receiving device 220 receives an analog input signal 130 from a signal source (for example, the image signal source 120), and the signal receiving device 220 converts the analog input signal 130 into a digital input signal 225. The processing unit 230 receives the digital input signal 225 and performs image processing/displaying on the digital input signal 225.

The processing unit 230 may includes a first gain control unit 240 because the present embodiment is implemented based on an image processing/display technique. The first gain control unit 240 receives the digital input signal 225 and adjusts the gain of the digital input signal 225 through an auto gain control technique, so as to allow the processing unit 230 to successfully perform related image processing on the digital input signal 225.

The electronic apparatus 210 in the present embodiment further includes an input capacitor C. The first terminal of the capacitor C is coupled to a signal input terminal 215 of the electronic apparatus 210, and the second terminal of the capacitor C is coupled to the input terminal of a signal conversion unit 222 in the signal receiving device 220. Thus, the input capacitor C can filter out noises at the signal input terminal 215 and allow the analog input signal 130 to be successfully transmitted from the signal input terminal 215 to the input terminal of the signal conversion unit 222. In some embodiments, because the input capacitor C is not disposed, the signal input terminal 215 of the electronic apparatus 210 is equivalent to the input terminal of the signal receiving device 220.

The signal receiving device 220 includes the signal conversion unit 222, a signal analysis unit 224, and an impedance unit 226. The signal conversion unit 222 receives the analog input signal 130 through the input capacitor C and converts the analog input signal 130 into a digital input signal 225. The signal analysis unit 224 is coupled to the output terminal of the signal conversion unit 222. The signal analysis unit 224 receives the digital input signal 225 and analyzes a signal characteristic of the digital input signal 225 through its own signal analysis mechanism to generate an impedance adjustment signal 227. The impedance unit 226 is coupled to the signal analysis unit 224 and the signal input terminal 215 of the electronic apparatus 210/the signal receiving device 220. The impedance unit 226 receives the impedance adjustment signal 227 to dynamically adjust the input impedance of the signal input terminal 215.

In the present embodiment, when the signal analysis unit 224 is implemented, the auto gain control function of an image processing chip can be used as the signal analysis mechanism of the signal analysis unit 224 for determining the difference of amplitude gain between the digital input signal 225 and a predetermined signal, wherein the predetermined signal conforms to the corresponding image standard specification. Thus, when the peak-to-peak voltage amplitude of the digital input signal 225 is greater than the voltage amplitude of the predetermined signal, it can be determined that the amplitude gain of the digital input signal 225 is too large while the input impedance thereof is too small. Accordingly, the signal analysis unit 224 controls the impedance unit 226 by using the impedance adjustment signal 227 to reduce the input impedance thereof. On the other hand, when the peak-to-peak voltage amplitude of the digital input signal 225 is smaller than the voltage amplitude of the predetermined signal, it can be determined that the amplitude gain of the digital input signal 225 is too small while the input impedance thereof is too large. Accordingly, the signal analysis unit 224 controls the impedance unit 226 by using the impedance adjustment signal 227 to increase the input impedance thereof.

Thereby, the signal receiving device 220 analyzes the amplitude gain of the analog input signal 130 through the auto gain control technique and then dynamically adjusts the input impedances of the signal receiving device 220 and the electronic apparatus 210 through the impedance unit 226, so as to maintain the amplitude gain of the analog input signal 130 to be within the limited input ranges of the signal receiving device 220 and the electronic apparatus 210.

It should be noted that the signal conversion unit 222, the signal analysis unit 224, the impedance unit 226, and even the processing unit 230 in the signal receiving device 220 can be integrated into a signal processing chip (for example, an image display chip). Thus, in the signal receiving device 220, an input resistor originally disposed outside the IC is implemented by using the impedance unit 226 (for example, a metal-oxide-semiconductor field-effect transistor (MOSFET)) in the IC so that both the fabrication cost and the circuit area of the electronic apparatus 210 are reduced. Herein the impedance of the impedance unit 226 can be adjusted to an appropriate value according to the actual requirement. Herein all embodiments of the invention are described by taking MOSFET as example. However, the invention is not limited to the adoption of MOSFET to achieve the expected functions, and those implementing the present embodiment should be able to use other types of transistors to achieve such functions through appropriate combination of the transistors.

Figure 3:
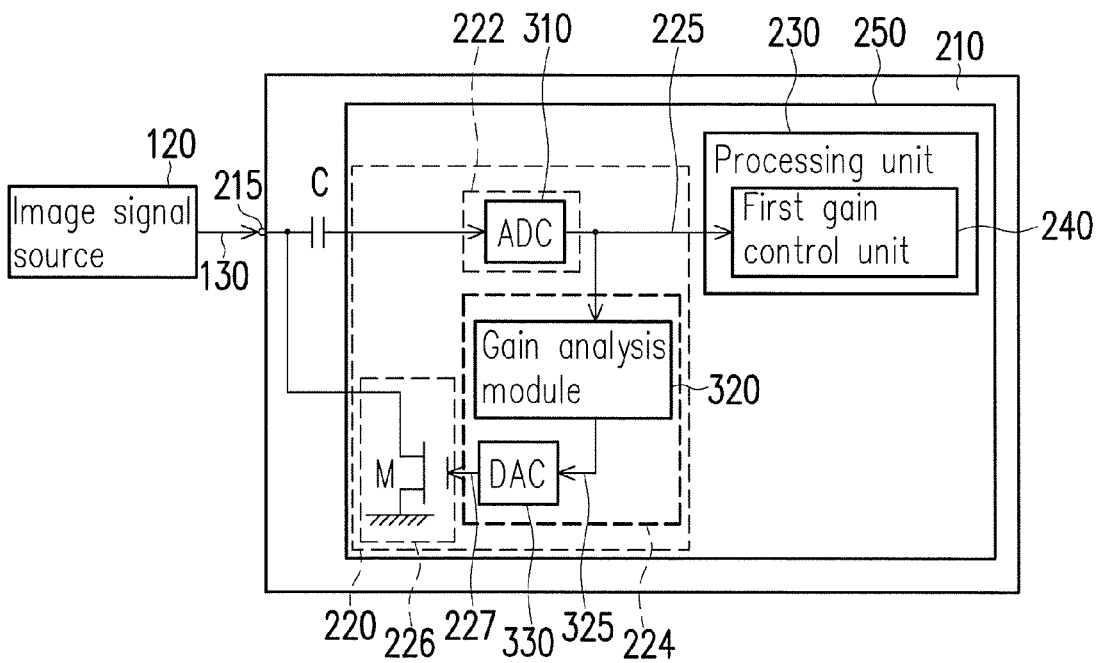
FIG. 3 is a detailed function block diagram of an electronic apparatus according to an embodiment of the invention.

Herein the present embodiment will be explained in detail with reference to FIG. 3. FIG. 3 is a detailed function block diagram of the electronic apparatus 210 according to an embodiment of the invention. The signal conversion unit 222 in the present embodiment is implemented by using an analog-to-digital converter (ADC) 310. The signal analysis unit 224 includes a gain analysis module 320 and a digital-to-analog conversion module (for example, a digital-to-analog converter (DAC)) 330. The gain analysis module 320 receives the digital input signal 225 and analyzes the amplitude gain of the digital input signal 225 relative to a predetermined signal in the gain analysis module 320 through an auto gain analysis technique. In the present embodiment, after the gain analysis module 320 analyzes the amplitude gain of the digital input signal 225 relative to the predetermined signal, it determines the corresponding input impedance according to the amplitude gain, so as to obtain an optimal digital impedance signal 325. For example, the gain analysis module 320 can obtain the corresponding digital impedance signal 325 according to the amplitude gain through a built-in gain mapping table. Those implementing the present embodiment may also implement the gain analysis module 320 through other techniques, which will not be described herein.

The impedance unit 226 can be implemented by using a MOSFET M. One terminal of the MOSFET M is coupled to the signal input terminal 215 of an image signal source 210, and another terminal of the MOSFET M is coupled to the ground GND. In the present embodiment, because the digital impedance signal 325 generated by the gain analysis module 320 cannot directly control the MOSFET M, the signal analysis unit 224 further includes a digital-to-analog conversion module (for example, a DAC) 330 coupled to the gain analysis module 320. The DAC 330 receives the digital impedance signal 325 and converts the digital impedance signal 325 into the analog impedance adjustment signal 227.

The MOSFET M receives the analog impedance adjustment signal 227 and accordingly is in a triode region (also referred to as a linear region). In this case, the characteristics at the two terminals of the MOSFET M are similar to those of a resistor, so that the impedance of the MOSFET M can be adjusted with the impedance adjustment signal 227. Thus, in the signal receiving device 220 and the electronic apparatus 210 using the same, an input resistor originally disposed outside an IC 250 can be implemented by using the impedance unit 226 (for example, the MOSFET M) inside the IC 250, so that both the fabrication cost and the circuit area of the electronic apparatus 210 are reduced.

As described above, in a signal receiving device provided by an embodiment of the invention, the amplitude gain of an input signal is analyzed through an auto gain control technique, and the input impedance of the signal receiving device is dynamically adjusted by using an impedance unit, so that the amplitude gain of the input signal can be maintained within a limited input range of the signal receiving device. On the other hand, in the signal receiving device, an input resistor originally disposed outside an IC is implemented by using an impedance unit (for example, a MOSFET) inside the IC, so that the fabrication cost of the electronic apparatus is reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A signal receiving device, comprising:
 a signal conversion unit, receiving an analog input signal and converting the analog input signal into a digital input signal;
 a signal analysis unit, coupled to the signal conversion unit, receiving the digital input signal, and analyzing a signal characteristic of the digital input signal to generate an impedance adjustment signal; and
 an impedance unit, coupled to the signal analysis unit and a signal input terminal of the signal receiving device, and receiving the impedance adjustment signal to dynamically adjust an input impedance of the signal input terminal, wherein the impedance unit comprises:
  a transistor, having a first terminal coupled to the signal input terminal, a second terminal coupled to a ground (GND), and a control terminal receiving the impedance adjustment signal.

2. The signal receiving device according to claim 1, wherein the signal analysis unit comprises:
 a gain analysis module, receiving the digital input signal, and analyzing an amplitude gain of the digital input signal relative to a predetermined signal to generate a digital impedance signal; and
 a digital-to-analog conversion module, coupled to the gain analysis module, receiving the digital impedance signal, and converting the digital impedance signal into the analog impedance adjustment signal.

3. The signal receiving device according to claim 1, wherein the signal conversion unit is an analog-to-digital converter.

4. The signal receiving device according to claim 1 further comprising:
a processing unit, comprising a first gain control unit, wherein the first gain control unit receives the digital input signal and adjusts a gain of the digital input signal, and the processing unit processes the digital input signal.

5. The signal receiving device according to claim 1, wherein the signal conversion unit, the signal analysis unit, and the impedance unit are implemented as an integrated circuit (IC).

6. An electronic apparatus, comprising:
a signal receiving device, receiving an analog input signal from a signal source, and converting the analog input signal into a digital input signal; and
a processing unit, receiving and processing the digital input signal,
wherein the signal receiving device comprises:
a signal conversion unit, receiving the analog input signal and converting the analog input signal into a digital input signal;
a signal analysis unit, coupled to the signal conversion unit, receiving the digital input signal, and analyzing a signal characteristic of the digital input signal to generate an impedance adjustment signal; and
an impedance unit, coupled to the signal analysis unit and a signal input terminal of the signal receiving device, and receiving the impedance adjustment signal to dynamically adjust an input impedance of the signal input terminal, wherein the impedance unit comprises:
a transistor, having a first terminal coupled to the signal input terminal, a second terminal coupled to a ground (GND), and control terminal receiving the impedance adjustment signal.

7. The electronic apparatus according to claim 6, wherein the signal analysis unit comprises:
a gain analysis module, receiving the digital input signal, and analyzing an amplitude gain of the digital input signal relative to a predetermined signal to generate a digital impedance signal; and
a digital-to-analog conversion module, coupled to the gain analysis module, receiving the digital impedance signal, and converting the digital impedance signal into the analog impedance adjustment signal.

8. The electronic apparatus according to claim 6 further comprising:
a capacitor, having a first terminal coupled to the signal input terminal of the electronic apparatus, and a second terminal coupled to an input terminal of the signal conversion unit.

\* \* \* \* \*